United States Patent
Lee et al.

(10) Patent No.: US 8,890,104 B2
(45) Date of Patent: Nov. 18, 2014

(54) RESISTIVE MEMORY DEVICE AND FABRICATION METHOD THEREOF

(75) Inventors: Min Yong Lee, Icheon-si (KR); Young Ho Lee, Icheon-si (KR); Seung Beom Baek, Icheon-si (KR); Jong Chul Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/598,244

(22) Filed: Aug. 29, 2012

(65) Prior Publication Data
US 2013/0228733 A1    Sep. 5, 2013

(30) Foreign Application Priority Data
Mar. 5, 2012   (KR) .................. 10-2012-0022436

(51) Int. Cl.
*H01L 29/02*   (2006.01)

(52) U.S. Cl.
USPC ........ 257/2; 257/190; 257/E47.001; 257/290; 438/48; 438/166; 438/382; 438/492

(58) Field of Classification Search
USPC .................. 257/2–5, 190, 195, 290, E47.001; 438/48, 166, 382, 492
See application file for complete search history.

(56) References Cited

U.S. PATENT DOCUMENTS

| 8,208,320 B2 * | 6/2012 | Kanda ........................... 365/191 |
| 2009/0101883 A1 * | 4/2009 | Lai et al. ............................ 257/3 |
| 2011/0068319 A1 * | 3/2011 | Tsukamoto et al. ............... 257/5 |
| 2011/0110149 A1 * | 5/2011 | Scheuerlein .................. 365/163 |

FOREIGN PATENT DOCUMENTS

| KR | 1020110018385 | 2/2011 |
| KR | 1020110087855 | 8/2011 |

* cited by examiner

*Primary Examiner* — Mark A Laurenzi
(74) *Attorney, Agent, or Firm* — IP & T Group LLP

(57) ABSTRACT

A resistive memory device and a fabrication method thereof are provided. The resistive memory device includes a variable resistive layer formed on a semiconductor substrate in which a bottom structure is formed, a lower electrode formed on the variable resistive layer, a switching unit formed on the lower electrode, and an upper electrode formed on the switching unit.

1 Claim, 3 Drawing Sheets

RESISTIVE MEMORY DEVICE AND FABRICATION METHOD THEREOF

CROSS-REFERENCES TO RELATED APPLICATION

This application claims priority under 35 U.S.C. 119(a) to Korean application number 10-2012-0022436, filed on Mar. 5, 2012, in the Korean Patent Office, which is incorporated by reference in its entirety.

BACKGROUND

1. Technical Field

The exemplary embodiments of the present invention relates to a semiconductor device, and more particularly, to a resistive memory device and a fabrication method thereof.

2. Related Art

As typical next-generation memories which replace dynamic random access memories (DRAMs) or flash memories, there are resistive memory devices. The resistive memory devices are memory devices using a variable resistive material which switches at least between two different resistance states by rapidly changing its resistance in response to an applied voltage.

As an example of the resistive memories, there are phase-change random access memories (PCRAMs). The PCRAM generally includes a switching element, a lower electrode formed on the switching element, a phase-change material pattern formed on the lower electrode, and an upper electrode formed on the phase-change material pattern.

As a phase-change material mainly used in the PCRAMs, there is Germanium-antimony-tellurium (Ge—Sb—Te, GST). A melting point of GST is about 630° C. and GST transitions from an amorphous state into a crystalline state at a crystallization temperature which is about 150° C.

A diode is mainly used as the switching element of the PCRAM and a method of forming a diode is accompanied by a high temperature process of 1000° C. or more.

In general, in a single-layered PCRAM, the diode is formed and then the phase-change material layer is formed so that high heat applied in the fabrication process of the diode does not affect the phase-change material.

With demands on high integration of semiconductor devices, memory cells with a multi-layered stack (MLS) structure are being fabricated. In the PCRAM cell having the MLS structure, two or more stages of cells are stacked, that is, an upper stage cell (including a diode/a lower electrode/a phase-change material pattern) is formed on a structure in which a lower stage cell (including a diode/a lower electrode/a phase-change material pattern) is formed.

Since a process of forming the diode for the upper stage cell is accompanied by a high temperature process, a thermal attack may occur in the phase-change material pattern, which has been already formed in the lower stage cell.

Therefore, a method of forming a diode using a laser annealing process has been considered. The laser annealing process for forming the diode may be performed at a temperature of 1000° C. for a short time of 0.5 ms and thus protect the phase-change material pattern of the lower stage cell by shortening a high-temperature application time.

However, even when the annealing process using laser is applied to form the diode, the effect on the phase-change material pattern of the lower stage cell may still exist and thus it may be difficult to ensure desired fabrication yield and operation reliability for the fabricated memory cell.

SUMMARY

According to one aspect of an exemplary embodiment, there is a provided a resistive memory device. The resistive memory device may include a variable resistive layer formed on a semiconductor substrate, a lower electrode formed on the variable resistive layer, a switching unit formed on the lower electrode, and an upper electrode formed on the switching unit.

According to another aspect of an exemplary embodiment, there is a provided a resistive memory device. The resistive memory device may include at least a common interconnection line, and a plurality of unit resistive memory cells stacked with the common interconnection line therebetween. At least one of the plurality of unit resistive memory cells may include a variable resistive layer, a heater formed on the variable resistive layer, and a switching unit formed on the heater.

According to another aspect of an exemplary embodiment, there is a provided a resistive memory device. The resistive memory device may include a plurality of unit resistive memory cells stacked, each of the plurality of unit resistive memory cells having a stacked structure of a switching unit, a heater, and a variable resistive layer, a switching unit of a unit resistive memory cell formed in an upper layer includes a first electrode and a second electrode, the first electrode and second electrode of the switching unit formed in the upper layer formed by crystallizing a first amorphous semiconductor layer and a second amorphous semiconductor layer using a metal induced crystallization (MIC) process, respectively, wherein the first amorphous semiconductor layer and the second amorphous semiconductor layer are continuously formed using a gas cluster ion beam (GCIB).

According to another aspect of an exemplary embodiment, there is a provided a resistive memory device. The resistive memory device may include a first interconnection line, a first resistive memory cell formed on the first interconnection line and including a first switching unit, a first heater, and a variable resistive layer sequentially stacked, a second resistive memory cell formed on the first resistive memory cell and including the variable resistive layer, a second heater, and a second switching unit sequentially stacked, and a second interconnection line formed on the second resistive memory cell.

According to another aspect of an exemplary embodiment, there is a provided a method of fabricating a resistive memory device. The method may include forming a first amorphous semiconductor layer and a second amorphous semiconductor layer stacked on the first semiconductor layer using a GCIB process, and crystallizing the first semiconductor layer and the second semiconductor layer using a MIC process.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
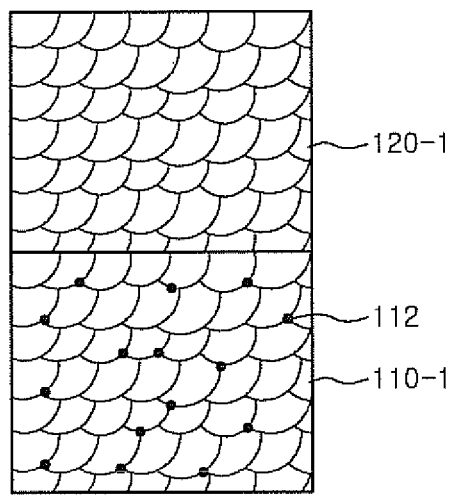
FIGS. 1 and 2 are views illustrating a method of forming a diode of a resistive memory device according to an exemplary embodiment of the inventive concept.

Hereinafter, exemplary embodiments will be described in greater detail with reference to the accompanying drawings.

Exemplary embodiments are described herein with reference to illustrations that are schematic illustrations of exemplary embodiments (and intermediate structures). As such, actual sizes and proportions of implemented exemplary embodiments may vary from the illustrated sizes and proportions. Further, exemplary embodiments should not be construed as limited to the particular shapes of regions illustrated herein but construed to include deviations in shapes that result from actual implementation. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2:
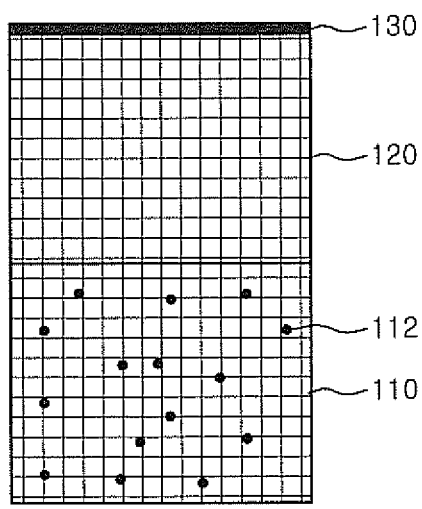

FIGS. 1 and 2 are view illustrating a method of forming a diode of a resistive memory device according to an exemplary embodiment.

First, as shown in FIG. 1, a first amorphous semiconductor layer 110-1 and a second amorphous semiconductor layer 120-1 are formed using a gas cluster ion beam (GCIB) process. At this time, the first semiconductor layer 110-1 may be doped with the impurities 112 when forming the first semiconductor layer 110-1. Instead of the first semiconductor layer 110-1, the second semiconductor layer 120-1 may be doped with the impurities 112 when the first and second semiconductor layers are formed.

Next, a metal induced crystallization (MIC) process is performed. The MIC process may be performed at a temperature of 400° C. or less, preferably, a temperature of 300 to 400° C. and nickel (Ni) may be used as a metal catalyst.

Thereby, as shown in FIG. 2, the first and second semiconductor layers 110-1 and 120-1 are crystallized to form a first electrode layer 110 and a second electrode layer 120. Since the crystallization is induced using the metal catalyst, silicidation occurs on a surface of the second electrode layer 120, that is, a silicide layer 130 is formed on a surface of the diode 10 without a separate silicidation process.

The GCIB process is a process used in injecting an impurity. Ions clustering in GCIB equipment form a layer at a room temperature. In the inventive concept, the amorphous first and second amorphous semiconductor layers 110-1 and 120-1 are formed through the GCIB process using such a feature.

A crystallization process is to be performed for the amorphous semiconductor layers to serve as the electrodes. However, when a high temperature process for crystallization is performed in a state in which a variable resistive layer has been formed below the amorphous semiconductor layer, a thermal damage is caused in the variable resistive layer. Therefore, in the inventive concept, the crystallization process is performed using an MIC process.

In fact, it has been confirmed that an amorphous silicon layer is crystallized when an electric field of 360 V/cm and heat of 380° C. are applied to the amorphous silicon layer using Ni as a catalyst. That is, an electrode layer for a diode may be crystallized at a low temperature of 400° C. or less so that a reliable diode may be formed without affecting the variable resistive layer formed below the diode.

In particular, in the inventive concept, the first and second semiconductor layers 110-1 and 120-1 are crystallized using an MIC process to form the first and second electrode layers 110 and 120 and thus silicidation for the surface of the diode is performed by metal used in the MIC process to form the silicide layer 130 in the surface of the diode. Thereby, a separate silicidation may not be performed for an ohmic contact between the diode and the heater and thus a process procedure may be shortened.

As described above, the diode according to the exemplary embodiment may include the first and second electrode layers 110 and 120 and the first and second electrode layers 110 and 120 may be formed by crystallizing the amorphous semiconductor layers, which are continuously formed using a GCIB, using an MIC process. In addition, any one of the first and second electrode layers 110 and 120 may be an electrode layer doped with impurities.

The diode 10 according to the above-described exemplary embodiment may be formed even through a low temperature process. In the existing resistive memory cell, since a variable resistive layer is thermally damaged in a high temperature process for a diode, the variable resistive layer is generally formed after the diode is formed. However, as in the exemplary embodiment, since the diode may be formed even at a low temperature, the diode may be formed after the variable resistive layer is formed.

Figure 3:
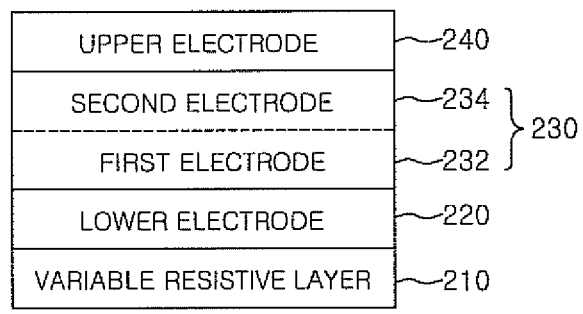
FIG. 3 is a view illustrating a structure of a resistive memory device according to an exemplary embodiment of the inventive concept.

FIG. 3 is a view illustrating a structure of a resistive memory device according to an exemplary embodiment.

As shown in FIG. 3, a resistive memory device 20 according to an exemplary embodiment includes a variable resistive layer (or phase-change layer) 210, a lower electrode 220 formed on the variable resistive layer 210, a diode 230 formed on the lower electrode 220 through a low temperature process, and an upper electrode 240 formed on the diode 230.

The diode 230 includes a first electrode 232 and a second electrode 234. The diode 230 may be a diode formed by continuously forming a first amorphous semiconductor layer and a second amorphous semiconductor layer using a GCIB process and crystallizing the first and second semiconductor layers using an MIC process as described in FIG. 2. In addition, any one of the first electrode 232 and the second electrode 234, preferably, the first electrode 232 may be doped with impurities.

In the exemplary embodiment, the diode 230 is formed through a low temperature process. Therefore, the variable resistive layer 210 may be formed before the diode 230 is formed. Thereby, the resistive memory device 20 having a structure in which the variable resistive layer 210, the lower electrode 220, and the diode 230 are sequentially stacked may be formed, differently from a cell structure of the existing resistive memory device.

Figure 4:
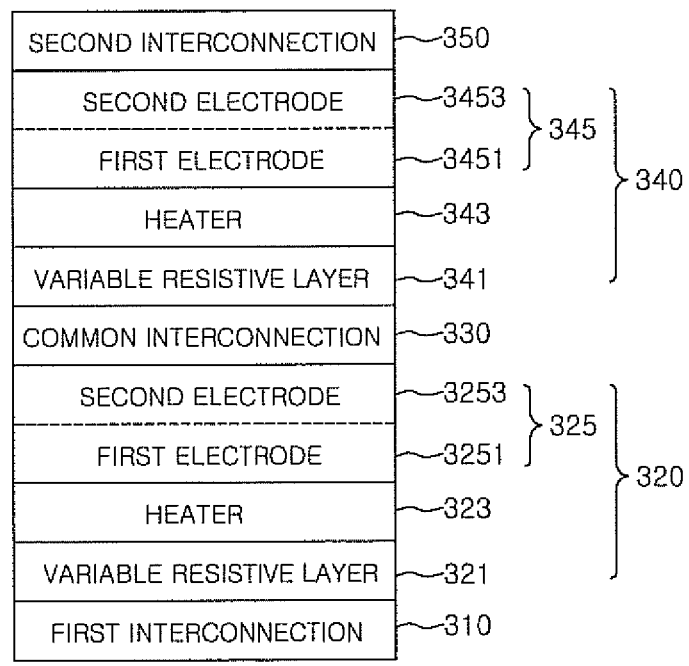
FIG. 4 is a view illustrating a structure of a resistive memory device according to another exemplary embodiment of the inventive concept.

FIG. 4 is a view illustrating a structure of a resistive memory device according to another exemplary embodiment.

A resistive memory device 30 shown in FIG. 4 has an MLS structure in which a plurality of cells 320 and 340 are stacked and includes a first cell 320 formed on a first interconnection 310, a common interconnection 330 formed on the first cell 320, a second cell 340 formed on the common interconnection 330, and a second interconnection 350 formed on the second cell 340.

Each of the first and second cells 320 and 340 has a structure in which a variable resistive layer (or phase-change layer) 321 and 341, a heater 323 and 343, and a diode 325 and 345 are sequentially stacked.

In each of cells 320 and 340 constituting the resistive memory device 30 according to the exemplary embodiment, the diode 325 and 345 serving as a switching element may be a diode having a first electrode 3251 and 3451 and a second electrode 3253 and 3453 formed by forming a first amorphous semiconductor layer and a second amorphous semiconductor layer using a GCIB process and crystallizing the first and second semiconductor layers using an MIC process. In addition, any one of the first electrode 3251 and 3451 and the second electrode 3253 and 3453, preferably, the first electrode 3251 and 3451 may be doped with impurities.

Figure 5:
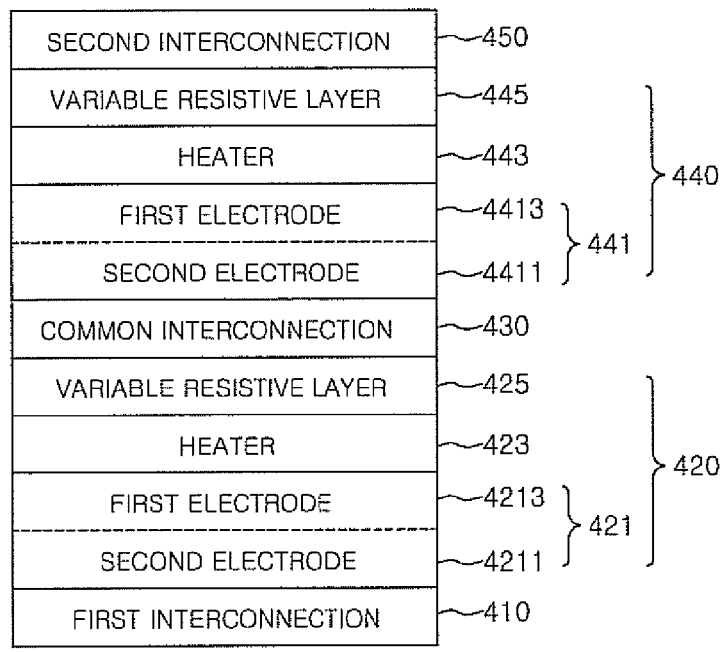
FIG. 5 is a view illustrating a structure of a resistive memory device according to another exemplary embodiment of the inventive concept.

FIG. 5 is a view illustrating a structure of a resistive memory device according to still another exemplary embodiment.

A resistive memory device 40 shown in FIG. 5 is a resistive memory device having an MLS structure in which a plurality of unit cells are stacked. Each of unit cells has a general structure, that is, a structure in which a heater and a variable resistive layer are formed on a diode.

As shown in FIG. 5, the resistive memory device 40 has a structure in which a first interconnection 410, a first cell 420, a common interconnection 430, a second cell 440, and a second interconnection 450 are sequentially stacked. Each of the cells 420 and 440 has a structure in which a heater 423 and 443 and a variable resistive layer (or phase-change layer) 425 and 445 are sequentially stacked on a diode 421 and 441.

In the resistive memory device 40, the diode 421 of the first cell 420 may be formed through a well-known general fabrication process. However, when the diode 441 of the second cell 440 is formed through the general fabrication process, the variable resistive layer 425 which has been already formed in the first cell 420 may be damaged by a high temperature process of 1000° C. or more, which is included in the general fabrication process.

Therefore, the diode 441 of the second cell 440 is formed by the above-described GCIB process and MIC process. That is, a first semiconductor layer and a second semiconductor layer are continuously formed by the GCIB process and then are crystallized by the MIC process to form a first electrode 4213 and 4413 and a second electrode 4211 and 4411. Here, any one of the first electrode 4213 and 4413 and the second electrode 4211 and 4411, preferably, the first electrode 4213 and 4413 may be doped with impurities.

Figure 6:
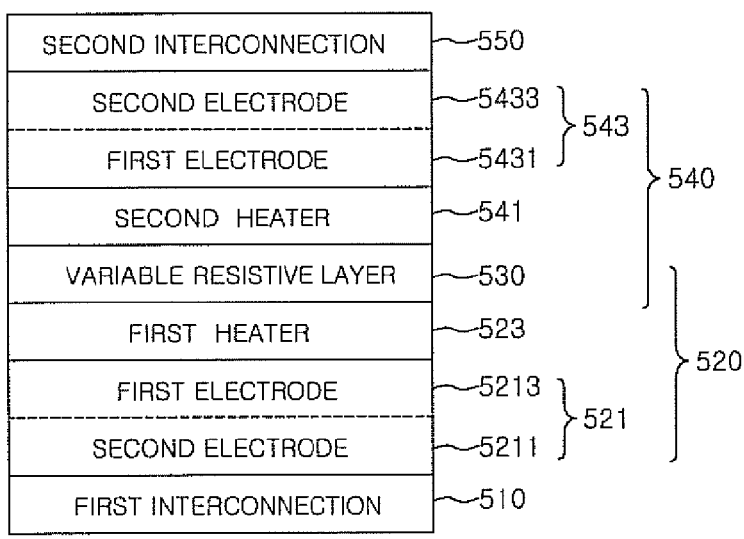
FIG. 6 is a view illustrating a structure of a resistive memory device according to another exemplary embodiment of the inventive concept.

FIG. 6 is a view illustrating a structure of a resistive memory device according to still another exemplary embodiment.

A resistive memory device 50 shown in FIG. 6 is an example of an MLS cell having a symmetrical structure on the basis of a variable resistive layer (or a phase-change layer) 530.

As shown in FIG. 6, a first interconnection 510, a first cell 520, a second cell 540, and a second interconnection 550 are sequentially stacked and the first cell 520 and the second cell 540 face each other with the variable resistive layer to be shared.

In addition, the first cell 520 has a structure in which a diode 521, a first heater 523, and the variable resistive layer 530 are sequentially stacked and the second cell 540 has a structure in which the variable resistive layer 530, a second heater 541, and a diode 543 are sequentially stacked.

In this case, since the diode 543 of the second cell 540 is fabricated after the variable resistive layer 530 is formed, the diode 543 of the second cell 540 is to be fabricated in a low temperature process so that the variable resistive layer 530 may be safely protected. Therefore, the first semiconductor layer and the second semiconductor layer, which are continuously formed using a GCIB process, are crystallized through an MIC process to form a first electrode 5431 and a second electrode 5433.

Although the resistive memory devices having various structures have been described, the resistive memory devices of the present invention are not limited thereto. Regardless of structures of the memory cells, a diode formed after a variable resistive layer is formed may be formed at a low temperature of 400° C. or less using a GCIB process and an MIC process. In addition, the diode before the variable resistive layer is formed may be also formed using the GCIB process and the MIC process.

The above-described exemplary embodiments are exemplary only, the present invention should include all embodiments consistent with the exemplary features as described above and in the accompanying drawings and claims.

What is claimed is:

1. A resistive memory device comprising:
    a first interconnection line;
    a first resistive memory cell formed on the first interconnection line and including a first switching unit, a first heater, and a variable resistive layer sequentially stacked;
    a second resistive memory cell formed on the first resistive memory cell and including the variable resistive layer, a second heater, and a second switching unit sequentially stacked; and
    a second interconnection line formed on the second resistive memory cell,
    wherein the first resistive memory cell and the second resistive memory cell share the variable resistive layer.

* * * * *